(12) United States Patent
Ito et al.

(10) Patent No.: US 7,978,008 B2
(45) Date of Patent: Jul. 12, 2011

(54) SUPPLY VOLTAGE CONTROL DEVICE FOR AMPLIFIER

(75) Inventors: Keiju Ito, Hamura (JP); Susumu Miura, Oume (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/859,406

(22) Filed: Aug. 19, 2010

(65) Prior Publication Data
US 2011/0050337 A1    Mar. 3, 2011

(30) Foreign Application Priority Data
Aug. 26, 2009    (JP) .................... 2009-195505

(51) Int. Cl.
  *H03G 3/20*    (2006.01)
(52) U.S. Cl. ........................................ 330/136; 330/297
(58) Field of Classification Search .................. 330/136, 330/297, 129, 285, 296
See application file for complete search history.

(56) References Cited

U.S. PATENT DOCUMENTS

| | | | | |
|---|---|---|---|---|
| 5,182,524 | A | * | 1/1993 | Hopkins ...................... 330/149 |
| 7,026,868 | B2 | * | 4/2006 | Robinson et al. ............... 330/10 |
| 7,696,818 | B2 | * | 4/2010 | Kunihiro et al. ............... 330/10 |
| 2003/0053552 | A1 | | 3/2003 | Hongo et al. |

FOREIGN PATENT DOCUMENTS
JP    2003-92518    3/2003
* cited by examiner

Primary Examiner — Henry K Choe
(74) Attorney, Agent, or Firm — Wenderoth, Lind & Ponack, L.L.P.

(57) ABSTRACT

A supply voltage control device for an amplifier that controls a supply voltage for the amplifier has been improved. The supply voltage control device includes: a supply voltage control circuit including an error amplification circuit that feeds an error current so as to control the supply voltage for the amplifier, and a direct current feed circuit that feeds a direct current (or the direct current and a current of a low-frequency component); a high-frequency component extraction unit that extracts a predetermined high-frequency component contained in a signal resulting from detection of an envelope relevant to a signal to be amplified by the amplifier; a peak hold unit that performs peak hold processing on a signal of the extracted high-frequency component; and an addition unit that adds up a signal based on the result of detection of the envelope relevant to the signal to be amplified by the amplifier, and the signal resulting from the peak hold processing, and inputs a signal resulting from the addition to the supply voltage control circuit.

9 Claims, 9 Drawing Sheets

Error Amplifier Output Current

Pulse Amplifier Output Current

SUPPLY VOLTAGE CONTROL DEVICE FOR AMPLIFIER

BACKGROUND OF THE INVENTION

1. Field of the Invention

The present invention relates to a supply voltage control device for an envelope tracking amplifier. More particularly, the present invention is concerned with a supply voltage control device for an amplifier capable of feeding a supply voltage, which is necessary to a power amplifier, while sustaining high efficiency, and ensuring the linearity of the power amplifier.

2. Description of the Related Art

In recent digital wireless communication systems, a multilevel modulation method in which a mean power of a signal and a peak power thereof largely differ from each other is often adopted in order to raise a transmission speed.

In conventional power amplification systems, when such a signal is handled, a constant voltage making it possible to output the peak power is fed to a power amplifier in order to ensure the linearity of the power amplifier.

However, a time during which the peak power is outputted is very short. As a result, the power supply efficiency of the power amplifier is degraded.

As a technology for solving the foregoing problem, an envelope tracking type power amplification system is known.

FIG. 6 shows an example of a configuration of an existing envelope tracking type power amplification system.

The power amplification system of the example includes an envelope detector 101, an error amplifier 21, a resistor (R) 22, a pulse width modulator 23, a pulse amplifier 24, a coil (L) 25, a delay circuit (Delay) 1, and a power amplifier 2.

For convenience' sake, in FIG. 6, the same reference numerals are assigned to processing components identical to those shown in FIG. 1 that is referred to in relation to an embodiment to be described later. FIG. 6 is not intended to unnecessarily limit the present invention.

An example of actions to be performed in the power amplification system of the example will be described below.

The delay circuit 1 delays an inputted modulating signal by a predetermined time in the process of transferring the signal to the power amplifier 2. The power amplifier 2 amplifies the input signal, which has passed through the delay circuit 1, and outputs it.

The modulating signal is also inputted to the envelope detector 101. The envelope detector 101 detects an envelope of the modulating signal, and outputs it to the error amplifier 21.

The detected envelope is inputted to the error amplifier 21. The error amplifier 21 amplifies by a predetermined gain an error between the envelope and the supply voltage for the power amplifier 2, and outputs the resultant error.

An output terminal of the error amplifier 21 and a supply voltage terminal of the power amplifier 2 are linked by the resistor 22. The pulse width modulator 23 generates a pulse width modulated signal according to a potential difference across the resistor 22, and outputs the pulse width modulated signal to the pulse amplifier 24.

The pulse amplifier 24 amplifies the pulse width modulated signal inputted from the pulse width modulator 23, and outputs the resultant signal to the coil 25.

The coil 25 links an output terminal of the pulse amplifier 24 and the supply voltage terminal of the power amplifier 2.

In the circuitry of the example, a supply voltage to be applied to the power amplifier 2 is varied in line with the envelope of the inputted modulating signal. For a current of a low-frequency component as well as a direct current, the voltage is fed from the highly efficient pulse amplifier 24. For a current of a high-frequency component, the voltage is fed from the error amplifier 21. Thus, the efficiency of the power amplifier 2 is upgraded.

Referring to FIG. 7A and FIG. 7B, the principles of operation of the envelope tracking type power amplification system in accordance with a related art will be described below.

In FIG. 7A, the axis of ordinates indicates a current outputted from the error amplifier 21, and the axis of abscissas indicates elapse of time. In FIG. 7B, the axis of ordinates indicates a current outputted from the pulse amplifier 24, and the axis of abscissas indicates elapse of time.

To begin with, a description will be made of a case where a direct-current (DC) component is inputted from the envelope detector 101 to the error amplifier 21.

When a DC voltage is inputted from the envelope detector 101, the error amplifier 21 feeds a current to the power amplifier 2 so as to output a voltage obtained by amplifying the input by a predetermined gain (time point a in FIGS. 7A and 7B).

Accordingly, the potential difference across the resistor 22 increases, and the pulse width modulator 23 activates the pulse amplifier 24. When the pulse amplifier 24 is activated, a current is fed to the power amplifier 2 through the coil 25. The current fed from the error amplifier 21 diminishes (an interval b in FIGS. 7A and 7B).

If the current to be fed from the error amplifier 21 diminishes, the potential difference across the resistor 22 decreases. When the potential difference becomes as small as a predetermined potential difference, the pulse width modulator 23 inactivates the pulse amplifier 24 (an interval c in FIGS. 7A and 7B).

If the pulse amplifier 24 is inactivated, the current to be fed to the power amplifier 2 through the coil 25 diminishes. The current to be fed from the error amplifier 21 increases. When the predetermined potential difference is attained, the pulse width modulator 23 activates the pulse amplifier 24 again (an interval d in FIGS. 7A and 7B).

By repeating the foregoing actions, a necessary current is fed to the power amplifier 2.

If the DC voltage is inputted, a current is fed mainly from the pulse amplifier 24. Out of a signal outputted from the pulse amplifier 24, a high-frequency component that cannot be removed by the coil 25 is compensated by the error amplifier 21.

In the example shown in FIGS. 7A and 7B, a hysteresis is preserved between the potential difference across the resistor 22 attained when the pulse amplifier 24 is activated, and the potential difference across the resistor 22 attained when the pulse amplifier 24 is inactivated.

Next, a description will be made of a case where an alternating-current (AC) voltage is inputted from the envelope detector 101 to the error amplifier 21.

An oscillation frequency of the pulse width modulator 23 is determined with a width of hysteresis or an inductance of the coil. For a frequency which the pulse width modulator 23 can follow, the power amplification system operates under the same principles as the principles of operation for the DC voltage.

For all frequency components the pulse width modulator 23 cannot follow, a current is fed from the error amplifier 21. Prior art reference JP-A-2003-092518.

SUMMARY OF THE INVENTION

In the existing envelope tracking type power amplification system shown in FIG. 6, actions are performed as described above with reference to FIGS. 7A and 7B. For example, when a high-voltage power amplifier is adopted as the power amplifier 2 or a broadband envelope is handled, the error amplifier 21 is requested to exhibit such performance as the capability of a broadband amplifier and a high slew rate. It is hard to realize the performance using a typical semiconductor. Therefore, a necessary supply voltage cannot be fed to the power amplifier 2. This poses a problem in that the linearity of the power amplifier 2 is lost.

The present invention is intended to break through the foregoing existing situation. An object of the present invention is to provide a supply voltage control device for an envelope tracking amplifier which can feed a necessary supply voltage to a power amplifier while sustaining high efficiency, and ensure the linearity of the power amplifier.

In order to accomplish the foregoing object, according to the present invention, a supply voltage control device for an amplifier that controls a supply voltage for an amplifier has a constitution described below.

Namely, the supply voltage control device includes a supply voltage control circuit having an error amplification circuit that feeds an error current so as to control the supply voltage for the amplifier, and a direct current feed circuit that feeds a direct current (or a direct current and a current of a low-frequency component) so as to control the supply voltage for the amplifier.

A high-frequency component extraction unit extracts a predetermined high-frequency component contained in a signal resulting from detection of an envelope relevant to a signal to be amplified by the amplifier. A peak hold unit performs peak hold processing on a signal of the high-frequency component extracted by the high-frequency component extraction unit. An addition unit adds up the signal based on the result of the detection of the envelope relevant to the signal to be amplified by the amplifier, and the signal resulting from the peak hold processing performed by the peak hold unit, and inputs a signal, which results from the addition, to the supply voltage control circuit.

A signal resulting from peak hold processing, which is performed on a signal of a predetermined high-frequency component contained in a signal resulting from detection of an envelope relevant to a signal to be amplified by the amplifier, is add to a signal resulting from detection of the envelope of the signal to be amplified by the amplifier. The supply voltage control circuit is activated with a signal resulting from the addition. Therefore, for example, in the supply voltage control device for the envelope tracking amplifier, a necessary supply voltage can be fed to the amplifier (for example, power amplifier) while high efficiency is sustained, and the linearity of the amplifier (for example, power amplifier) can be ensured.

Herein, the error amplification circuit included in the supply voltage control circuit can feed a current of a higher frequency than, for example, the direct current feed circuit can.

The direct current feed circuit included in the supply voltage control circuit can attain higher efficiency than, for example, the error amplification circuit can.

As the error amplification circuit or direct current feed circuit included in the supply voltage control circuit, any of various types of circuits may be adopted.

As a concrete example of the direct current feed circuit, a circuit employing pulse amplification or a circuit that feeds a constant voltage (or a constant current) may be adopted.

As the high-frequency component extraction unit, for example, a unit that extracts a high-frequency component which the supply voltage control circuit (error amplification circuit included in the supply voltage control circuit) cannot feed is adopted.

The frequency characteristic of the predetermined high-frequency component to be extracted by the high-frequency component extraction unit is, for example, determined in advance.

As the high-frequency component extraction unit, for example, a low-pass filtration unit and a subtraction unit may be adopted or a high-pass filtration unit may be adopted.

As the peak hold processing, any of various kinds of processing may be adopted.

As the envelope relevant to a signal to be amplified by the amplifier, for example, the envelope of the signal may be adopted. Alternatively, the envelope of a signal that differs from the signal in one or more of a form, which is a digital or analog form, an intermediate frequency, and a radiofrequency may be adopted.

As the signal resulting from detection of the envelope relevant to the signal to be amplified by the amplifier, for example, a signal obtained by performing predetermined processing on the signal resulting from detection of the envelope may be adopted. Alternatively, the signal resulting from the detection of the envelope may be adopted.

An example of the constitution of the supply voltage control device for an amplifier in accordance with the present invention will be described below.

Namely, the low-pass filtration unit passes a predetermined low-frequency component, which is contained in a signal resulting from detection of an envelope relevant to a signal to be amplified by the amplifier, (that is, extracts a predetermined low-frequency component).

The addition unit adds, as a signal based on the result of detection of an envelope relevant to a signal to be amplified by the amplifier, a signal that results from the detection of the envelope relevant to the signal to be amplified by the amplifier and that has passed through the low-pass filtration unit (that is, a signal of the extracted predetermined low-frequency component).

A signal resulting from peak hold processing performed on a signal of a predetermined high-frequency component, which is contained in a signal resulting from detection of an envelope relevant to a signal to be amplified by the amplifier, is added to a signal of a predetermined low-frequency component contained in the signal resulting from detection of the envelope relevant to the signal to be amplified by the amplifier (signal passed by the low-pass filtration unit). The supply voltage control circuit is activated with the signal resulting from the addition. Therefore, for example, in the supply voltage control device for the envelope tracking amplifier, a necessary supply voltage can be fed to the amplifier (for example, power amplifier) while high efficiency is sustained, and the linearity of the amplifier (for example, power amplifier) can be ensured.

Herein, the frequency characteristic of the predetermined low-frequency component to be passed by the low-pass filtration unit is, for example, determined in advance.

Further, as the predetermined low-frequency component to be passed by the low-pass filtration unit and the predetermined high-frequency component to be extracted by the high-frequency component extraction unit, for example, a low-frequency component and a high-frequency component that complement each other may be adopted. More particularly, a frequency on a border that determines the predetermined low-frequency component and a frequency on a border that determines the predetermined high-frequency component may be identical to each other (or analogous to each other).

As mentioned above, according to the present invention, for example, in the supply voltage control device for the envelope tracking amplifier, a necessary supply voltage can be fed to an amplifier (for example, power amplifier) while high efficiency is sustained, and the linearity of the amplifier (for example, power amplifier) can be ensured.

DETAILED DESCRIPTION OF THE INVENTION

Figure 1:
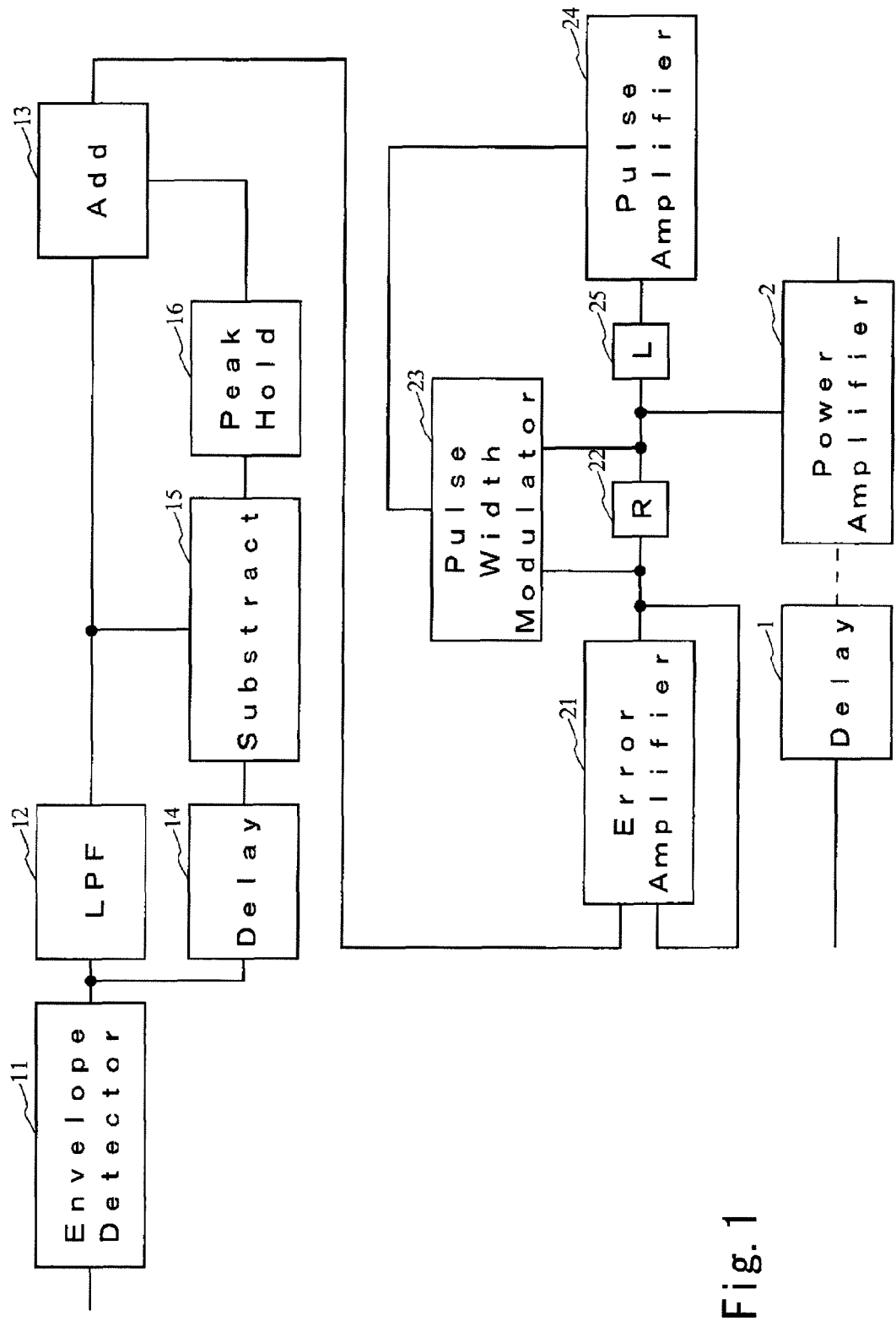
FIG. 1 is a diagram showing an example of the constitution of a power amplification system in accordance with a first embodiment of the present invention.

Referring to the drawings, embodiments of the present invention will be described below.

A power amplification system in accordance with an embodiment is preferably adapted to base-station or relay-station equipment in which a supply voltage for a power amplifier is high and which is included in a digital wireless communication system. Alternatively, the power amplification system may be adapted to other various types of equipment.

In the power amplification system in accordance with the present embodiment, for example, a signal to be transmitted is inputted, amplified, and then outputted. The signal is wirelessly transmitted through an antenna (for example, an antenna external to the power amplification system).

First Embodiment

A first embodiment of the present invention will be described below.

FIG. 1 shows an example of the constitution of an envelope tracking type power amplification system in accordance with an embodiment of the present invention.

The power amplification system of the present embodiment includes an envelope detector 11, a low-pass filter (LPF) 12, an adder (Add) 13, an envelope delay circuit (Delay) 14, a subtractor (Subtract) 15, a peak hold circuit (Peak Hold) 16, an error amplifier 21, a resistor (R) 22, a pulse width modulator 23, a pulse amplifier 24, a coil (L) 25, a delay circuit (Delay) 1, and a power amplifier 2.

Herein, the same signal is inputted to the delay circuit 1 and envelope detector 11. The signal may be varied in terms of, for example, a digital or analog form, or a frequency. More particularly, for example, a mode in which the signal is inputted as an analog signal to each of the delay circuit 1 and envelope detector 11 (examples shown in FIG. 1, FIG. 3, and FIG. 4), or a mode in which the signal is inputted as an analog signal to the delay circuit 1 and inputted as a digital signal to the envelope detector 11 (example shown in FIG. 2) may be adopted. Otherwise, a mode in which the signal is inputted as a radiofrequency (RF) signal to each of the delay circuit 1 and envelope detector 11, or a mode in which the signal is inputted as a radiofrequency signal to the delay circuit 1 and inputted as an intermediate-frequency (IF) signal to the envelope detector 11 may be adopted.

If necessary, a digital-to-analog converter, a frequency converter, a filter, or an amplifier may be interposed between the delay circuit 1 and power amplifier 2.

An example of actions to be performed in the power amplification system of the present embodiment will be described below.

The delay circuit 1 delays an inputted modulating signal by a predetermined time in the process of transferring the signal to the power amplifier 2. The power amplifier 2 amplifies the input signal, which has passed through the delay circuit 1, and outputs a resultant signal.

The modulating signal is also inputted to the envelope detector 11. The envelope detector 11 detects an envelope of the modulating signal, and outputs the detected envelope to each of the low-pass filter 12 and envelope delay circuit 14.

The low-pass filter 12 extracts only a low-frequency component of a signal having the envelope inputted from the envelope detector 11, and outputs the signal to each of the adder 13 and subtractor 15.

The envelope delay circuit 14 delays the signal, which has the envelope inputted from the envelope detector 11, by a predetermined time, and outputs the signal to the subtractor 15. Herein, a delay time to be given by the envelope delay circuit 14 is set to a value equal to a delay time caused by the low-pass filter 12. Namely, the inputting timing of the signal to the subtractor 15 is adjusted to coincide with the inputting timing of the low-frequency component to the subtractor 15.

The subtractor 15 subtracts a signal inputted from the low-pass filter 12 (a signal of the low-frequency component) from the signal inputted from the envelope delay circuit 14, extracts only a high-frequency component, and outputs the high-frequency component to the peak hold circuit 16.

The peak hold circuit 16 holds the peak of a signal inputted from the subtractor 15 (a signal of the high-frequency component), and outputs the peak to the adder 13. By holding the peak, the high-frequency component of the envelope is converted into a direct current or a low-frequency component.

The adder 13 adds up the signal inputted from the low-pass filter 12 and the signal inputted from the peak hold circuit 16, and outputs the result of the addition to the error amplifier 21.

The error amplifier 21 amplifies by a predetermined gain an error between the voltage of the signal inputted from the adder 13 and the supply voltage for the power amplifier 2, and outputs a resultant signal to the resistor 22.

The resistor 22 links an output terminal of the error amplifier 21 and a supply voltage terminal of the power amplifier 2.

The pulse width modulator 23 generates a pulse width modulated signal according to the potential difference across the resistor 22, and outputs the signal to the pulse amplifier 24.

The pulse amplifier 24 amplifies the pulse width modulated signal inputted from the pulse width modulator 23, and outputs the resultant signal to the coil 25.

The coil 25 links an output terminal of the pulse amplifier 24 and the supply voltage terminal of the power amplifier 2.

As mentioned above, according to the present embodiment, the envelope tracking type power amplification system in which a supply voltage to be applied to the power amplifier 2 is varied in line with the envelope of an inputted modulating signal includes: the power amplifier 2 that amplifies an inputted signal; the delay circuit 1 that delays the inputted modulating signal by a predetermined time in the process of transferring the signal to the power amplifier 2; the envelope detector 11 that detects the envelope of the modulating signal, the low-pass filter 12 that extracts only a low-frequency component from an output of the envelope detector 11; the envelope delay circuit 14 that delays the output of the envelope detector 11; the subtractor 15 that subtracts the output of the low-pass filter 12 from the output of the envelope delay circuit 14 so as to extract a high-frequency component; the peak hold circuit 16 that holds the peak signal of the output of the subtractor 15; the adder 13 that adds up the output of the low-pass filter 12 and the output of the peak hold circuit 16; the error amplifier 21 that amplifies by a predetermined gain the error between the output of the adder 13 and the supply voltage for the power amplifier 2; the resistor 22 that links the output terminal of the error amplifier 21 and the supply voltage terminal of the power amplifier 2; the pulse width modulator 23 that generates a pulse width modulated signal according to the potential difference across the resistor 22; the pulse amplifier 24 that amplifies the pulse width modulated signal outputted from the pulse width modulator 23; and the coil 25 that links the output terminal of the pulse amplifier 24 and the supply voltage terminal of the power amplifier 2.

In the envelope tracking type power amplification system of the present embodiment, a supply voltage to be applied to the power amplifier 2 is varied in line with the envelope of an inputted modulating signal. For a current of a low-frequency component as well as a direct current, the voltage is fed from the highly efficient pulse width modulator 23 to the power amplifier 2. For a current of a high-frequency component, the voltage is fed from the error amplifier 21 to the power amplifier 2. The high-frequency component of an envelope for which the voltage cannot be fed from the error amplifier 21 is converted into the direct current or low-frequency component by the peak hold circuit 16. Therefore, the supply voltage necessary to the power amplifier 2 can be ensured.

In the envelope tracking type power amplification system of the present embodiment, a high-frequency component of an envelope which the error amplifier 21 cannot follow is converted into a direct current component or a low-frequency component. Therefore, a necessary supply voltage can be fed to the power amplifier 2 while the high efficiency of the power amplifier 2 is sustained. Eventually, the linearly of the power amplifier 2 can be ensured, and the low-distortion and high-efficiency power amplification system can be realized.

In the present embodiment, the peak hold circuit 16 is designed simply to hold a peak for a certain period of time. As another example of the design, a peak hold circuit that decreases the amplitude of a peak signal with a certain time constant, or any of other various peak hold circuits may be adopted.

In the power amplification system of the present embodiment, processing components other than the envelope detector 11, delay circuit 1, and power amplifier 2 constitute a supply voltage control device for an amplifier. The error amplifier 21 and resistor 22 constitute an error amplification circuit included in a supply voltage control circuit. The resistor 22, pulse width modulator 23, pulse amplifier 24, and coil 25 constitute a direct current (which may contain a low-frequency component) feed circuit included in the supply voltage control circuit. The capability of the low-pass filter 12 realizes a low-pass filtration unit. The capabilities of the low-pass filter 12, envelope delay circuit 14, and subtractor 15 realize a high-frequency component extraction unit. The capability of the peak hold circuit 16 realizes a peak hold unit. The capability of the adder 13 realizes an addition unit.

In the present embodiment, the power amplifier 2 is an object for which a supply voltage is controlled, and the capability of the envelope detector 11 realizes an envelope detection unit.

Second Embodiment

A second embodiment of the present invention will be described below.

Figure 2:
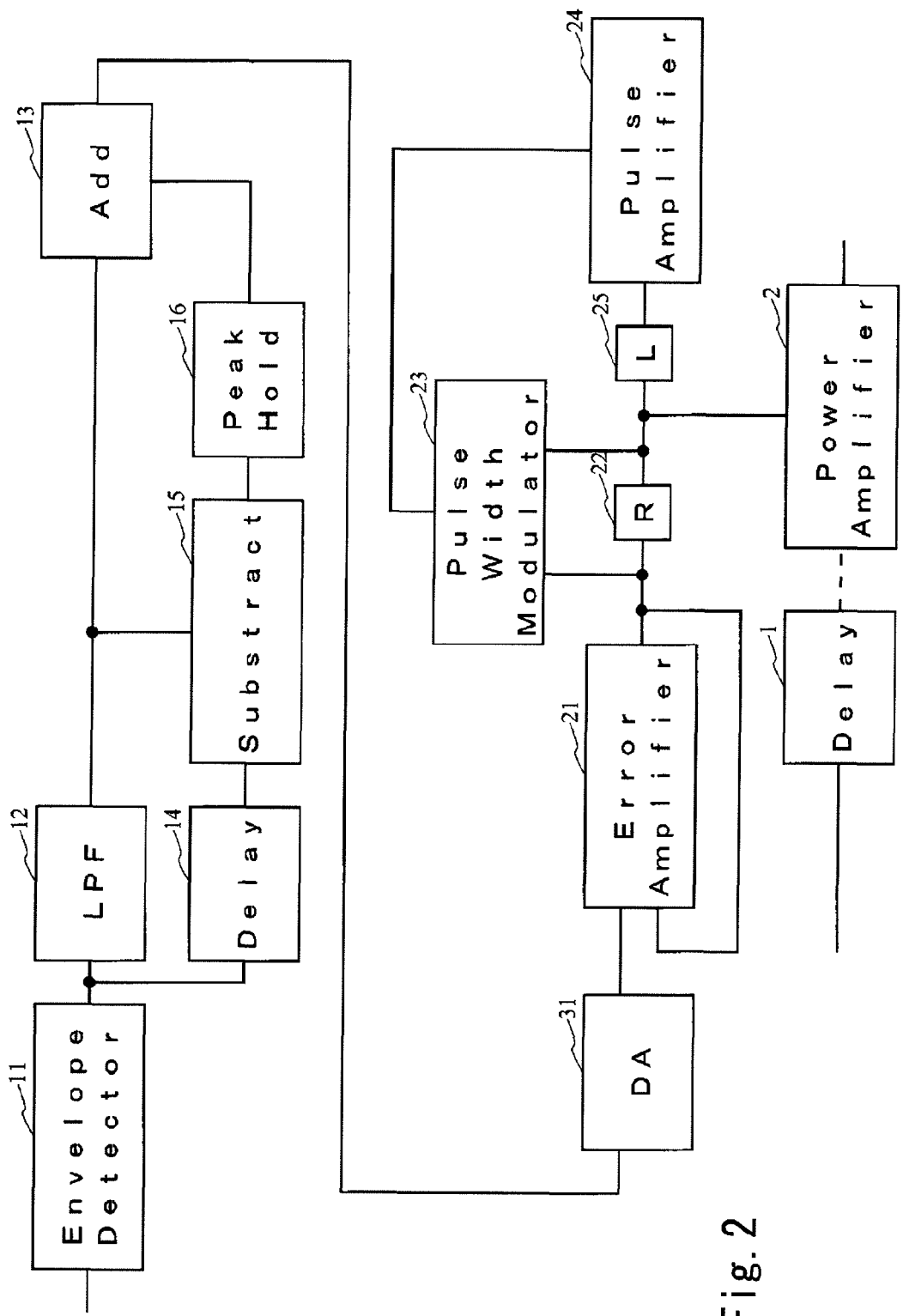
FIG. 2 is a diagram showing an example of the constitution of a power amplification system in accordance with a second embodiment of the present invention.

FIG. 2 shows an example of the constitution of an envelope tracking type power amplification system in accordance with an embodiment of the present invention.

The power amplification system of the present embodiment includes an envelope detector 11, a low-pass filter (LPF) 12, an adder (Add) 13, an envelope delay circuit (Delay) 14, a subtractor (Subtract) 15, a peak hold circuit (Peak Hold) 16, an error amplifier 21, a resistor (R) 22, a pulse width modulator 23, a pulse amplifier 24, a coil (L) 25, a delay circuit (Delay) 1, a power amplifier 2, and a digital-to-analog converter (DA) 31 that converts a digital signal into an analog signal.

The constitution of the power amplification system of the present embodiment is identical to that of the power amplification system shown in FIG. 1 except a point that the digital-to-analog converter 31 is interposed between the adder 13 and error amplifier 21, and the operation thereof is identical to that of power amplification system shown in FIG. 1 except that relating to the digital-to-analog converter 31. A description of the identical components will be omitted. For convenience' sake, in FIG. 2, the same reference numerals are assigned to processing components identical to those shown in FIG. 1.

In the present embodiment, the envelope detector 11, low-pass filter 12, envelope delay circuit 14, subtractor 15, peak hold circuit 16, and adder 13 are designed to perform digital processing. The digital-to-analog converter 31 inputs a signal outputted from the adder 13, converts it from a digital signal to an analog signal, and outputs the analog signal to the error amplifier 21.

The principles of operation of the present embodiment are identical to those of the embodiment shown in FIG. 1. Since the foregoing circuits are designed to perform digital processing, the necessity of adjusting the circuits is obviated. This is advantageous in that the circuits can be readily realized.

Third Embodiment

A third embodiment of the present invention will be described below.

Figure 3:
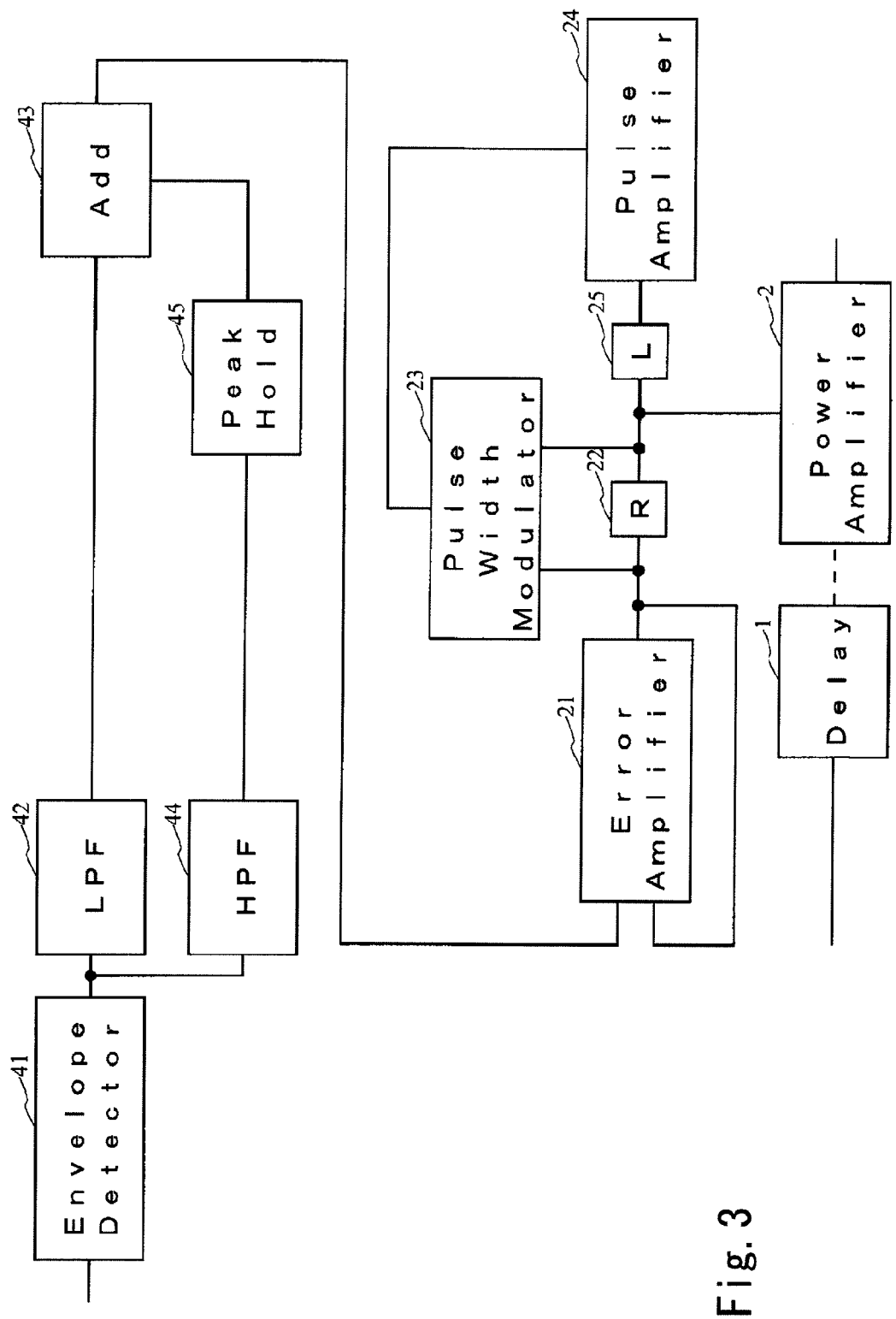
FIG. 3 is a diagram showing an example of the constitution of a power amplification system in accordance with a third embodiment of the present invention.

FIG. 3 shows an example of the constitution of an envelope tracking type power amplification system in accordance with an embodiment of the present invention.

The power amplification system of the present embodiment includes an envelope detector 41, a low-pass filter (LPF) 42, an adder (Add) 43, a high-pass filter (HPF) 44, a peak hold circuit (Peak Hold) 45, an error amplifier 21, a resistor (R) 22, a pulse width modulator 23, a pulse amplifier 24, a coil (L) 25, a delay circuit (Delay) 1, and a power amplifier 2.

The configuration of the power amplification system of the present embodiment and the operation thereof are identical to those of the power amplification system shown in FIG. 1 except those relating to the envelope detector 41, low-pass filter 42, adder 43, high-pass filter 44, and peak hold circuit 45. A description of the identical components will be omitted. For convenience' sake, in FIG. 3, the same reference numerals are assigned to processing components identical to those shown in FIG. 1.

More particularly, in the constitution shown in FIG. 1 or FIG. 2, an output of the low-pass filter 12 is subtracted from an output of the envelope delay circuit 14 in order to extract a high-frequency component of an envelope. In the constitution of the present embodiment, the high-pass filter 44 is used to achieve the extraction of the high-frequency component of the envelope.

The circuitry shown in FIG. 3 is equivalent to the circuitry shown in FIG. 1 or FIG. 2.

In the present embodiment, the envelope detector 41 detects the envelope of an inputted modulating signal, and outputs the detected envelope to each of the low-pass filter 42 and high-pass filter 44.

The low-pass filter 42 extracts only a low-frequency component of a signal having the envelope inputted from the envelope detector 41, and outputs the low-frequency component to the adder 43.

The high-pass filter 44 extracts only a high-frequency component of the signal having the envelope inputted from the envelope detector 41, and outputs the high-frequency component to the peak hold circuit 45.

The peak hold circuit 45 holds a peak of a signal inputted from the high-pass filter 44 (a signal of the high-frequency component), and outputs the peak to the adder 43.

The adder 43 adds up the signal inputted from the low-pass filter 42 and the signal inputted from the peak hold circuit 45, and outputs the result of the addition to the error amplifier 21.

Even in the constitution of the present embodiment, the power amplification system operates under the same principles as that shown in FIG. 1 or FIG. 2 does.

For example, when a delay time caused by the low-pass filter 42 and a delay time caused by the high-pass filter 44 are different from each other, it is necessary to insert a delay circuit, which makes the delay times equal to each other, to either of the filters causing a shorter delay time.

Incidentally, a supply voltage control device for an amplifier included in the power amplification system of the present embodiment includes the components assigned reference numerals different from the reference numerals shown in FIG. 1. The capability of the low-pass filter 42 realizes a low-pass filtration unit, and the capability of the high-pass filter 44 realizes a high-frequency component extraction unit. The capability of the peak hold circuit 45 realizes a peak hold unit, and the capability of the adder 43 realizes an addition unit.

Another example of the constitution of the third embodiment of the present invention will be described below.

Figure 8:
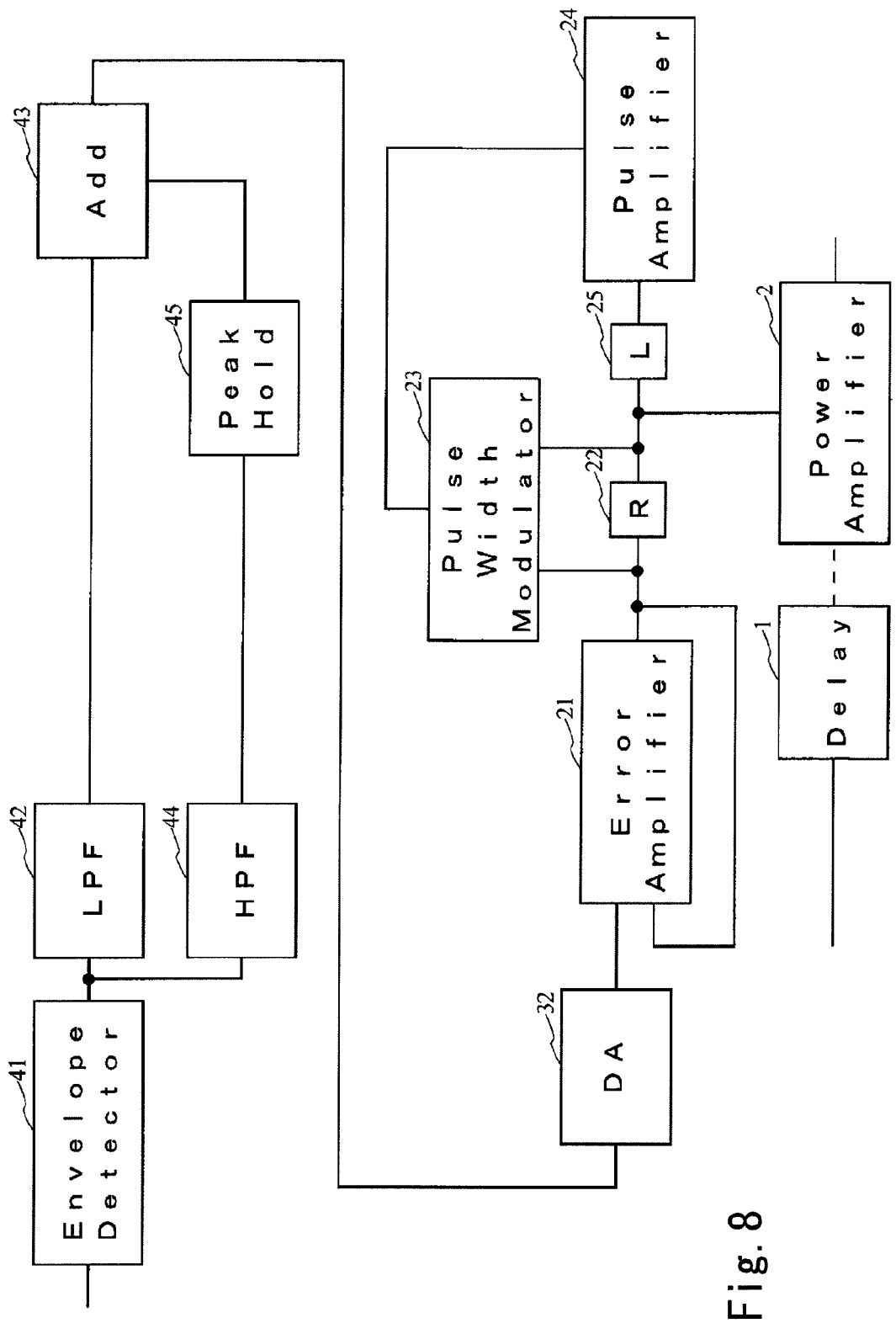
FIG. 8 is a diagram showing another example of the constitution of the power amplification system in accordance with the third embodiment of the present invention.

FIG. 8 shows an example of the constitution of the envelope tracking type power amplification system in accordance with the embodiment of the present invention.

The power amplification system of the present example includes an envelope detector 41, a low-pass filter (LPF) 42, an adder (Add) 43, a high-pass filter (HPF) 44, a peak hold circuit (Peak Hold) 45, an error amplifier 21, a resistor (R) 22, a pulse width modulator 23, a pulse amplifier 24, a coil (L) 25, a delay circuit (Delay) 1, a power amplifier 2, and a digital-to-analog converter (DA) 32 that converts a digital signal into an analog signal.

The constitution of the power amplification system of the present example is identical to that of the power amplification system shown in FIG. 3 except a point that the digital-to-analog converter 32 is interposed between the adder 43 and error amplifier 21, and the operation thereof is identical to that of the power amplification system shown in FIG. 3 except that relating to the digital-to-analog converter 32. A description of the identical components will be omitted. For convenience' sake, in FIG. 8, the same reference numerals are assigned to the processing components identical to those shown in FIG. 3.

In the present example, the envelope detector 41, low-pass filter 42, high-pass filter 44, peak hold circuit 45, and adder 43 are designed to perform digital processing. The digital-to-analog converter 32 inputs a signal outputted from the adder 43, converts it from a digital signal to an analog signal, and outputs the resultant signal to the error amplifier 21.

The principles of operation of the present example are identical to those of the embodiment shown in FIG. 3. Since the foregoing circuits are designed to perform digital processing, the necessity of adjusting the circuits is obviated. This is advantageous in that the circuits can be readily realized.

Fourth Embodiment

A fourth embodiment of the present invention will be described below.

Figure 4:
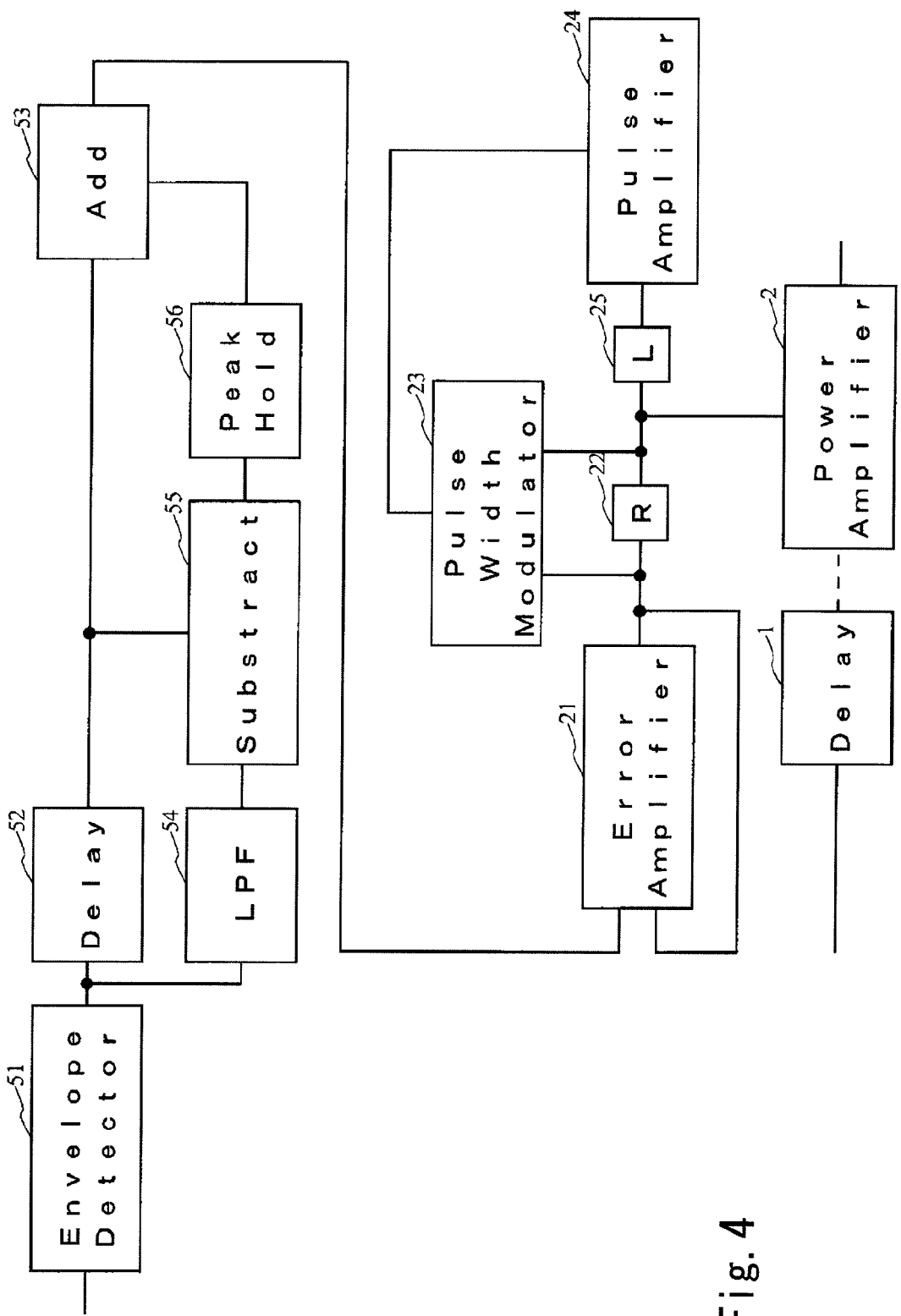
FIG. 4 is a diagram showing an example of the constitution of a power amplification system in accordance with a fourth embodiment of the present invention.

FIG. 4 shows an example of the constitution of an envelope tracking type power amplification system in accordance with an embodiment of the present invention.

The power amplification system of the present embodiment includes an envelope detector 51, an envelope delay circuit (Delay) 52, an adder (Add) 53, a low-pass filter (LPF) 54, a subtractor (Subtract) 55, a peak hold circuit (Peak Hold) 56, an error amplifier 21, a resistor (R) 22, a pulse width modulator 23, a pulse amplifier 24, a coil (L) 25, a delay circuit (Delay) 1, and a power amplifier 2.

The constitution of the power amplification system of the present embodiment and the operation thereof are identical to those of the power amplification system shown in FIG. 1 except those relating to the envelope detector 51, envelope delay circuit 52, adder 53, low-pass filter 54, subtractor 55, and peak hold circuit 56. A description of identical components will be omitted. For convenience' sake, in FIG. 4, the same reference numerals are assigned to the processing components identical to those shown in FIG. 1.

The envelope detector 51 detects the envelope of an inputted modulating signal, and outputs the detected envelope to each of the envelope delay circuit 52 and low-pass filter 54.

The low-pass filter 54 extracts only a low-frequency component of a signal having the envelope inputted from the envelope detector 51, and outputs the low-frequency component to the subtractor 55.

The envelope delay circuit 52 delays the signal, which has the envelope inputted from the envelope detector 51, by a predetermined time, and outputs the signal to each of the subtractor 55 and adder 53. Herein, a delay time given by the envelope delay circuit 52 is set to a value equal to a delay time caused by the low-pass filer 54. In other words, the inputting timing of the signal to the subtractor 55 is adjusted so that it coincides with the inputting timing of the low-frequency component to the subtractor 55.

The subtractor 55 subtracts a signal (a signal of the low-frequency component), which is inputted from the low-pass filter 54, from the signal inputted from the envelope delay circuit 52 so as to extract a high-frequency component alone, and outputs the high-frequency component to the peak hold circuit 56.

The peak hold circuit 56 holds the peak of the signal inputted from the subtractor 55 (the signal of the high-frequency component), and outputs the peak to the adder 53. By holding the peak, the high-frequency component of the envelope is converted into a direct current or a low-frequency component.

The adder 53 adds up the signal, which is inputted from the envelope delay circuit 52, and the signal inputted from the peak hold circuit 56, and outputs the result of the addition to the error amplifier 21.

In the constitutions shown in FIG. 1 to FIG. 3, the result of holding the peak of a high-frequency component of an envelope is added to a low-frequency component thereof. In the present embodiment, the result of holding the peak of the high-frequency component is added to the envelope. The result of the addition in the present embodiment is thought to be larger than the results obtained in the embodiments shown in FIG. 1 to FIG. 3. The present embodiment is thought to be effective in practice from a viewpoint of, for example, feeding a necessary supply voltage to the power amplifier 2.

A supply voltage control device for an amplifier included in the power amplification system of the present embodiment includes the components assigned reference numerals different from those shown in FIG. 1. A high-frequency component extraction unit is realized with the capabilities of the envelope delay circuit 52, low-pass filter 54, and subtractor 55. A peak hold unit is realized with the capability of the peak hold circuit 56, and an addition unit is realized with the capability of the adder 53.

Another example of the constitution of the fourth embodiment of the present invention will be described below.

Figure 9:
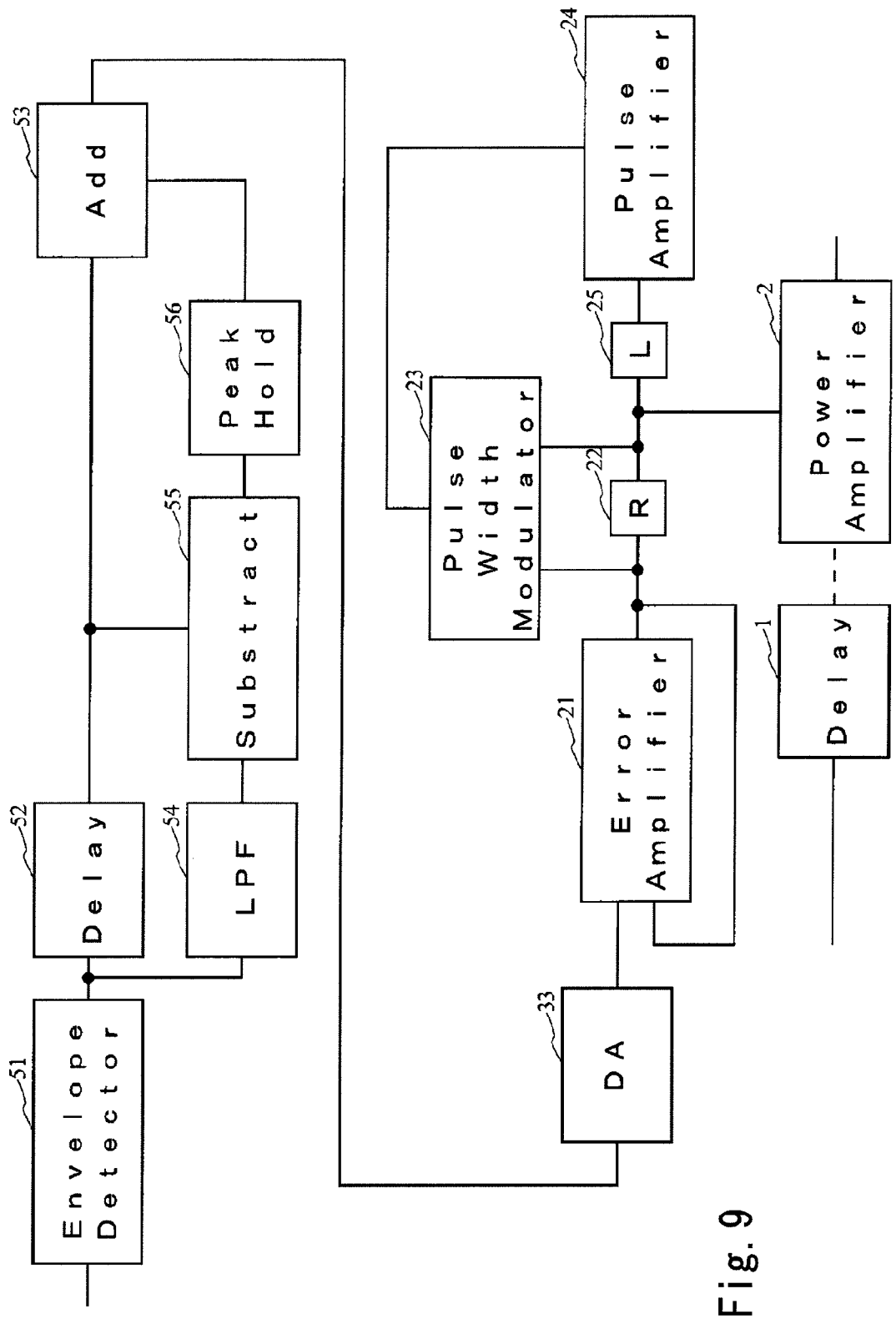
FIG. 9 is a diagram showing another example of the constitution of the power amplification system in accordance with the fourth embodiment of the present invention.

FIG. 9 shows an example of the constitution of the envelope tracking type power amplification system in accordance with the embodiment of the present invention.

The power amplification system of the present example includes an envelope detector 51, an envelope delay circuit (Delay) 52, an adder (Add) 53, a low-pass filter (LPF) 54, a subtractor (Subtract) 55, a peak hold circuit (Peak Hold) 56, an error amplifier 21, a resistor (R) 22, a pulse width modulator 23, a pulse amplifier 24, a coil (L) 25, a delay circuit (Delay) 1, a power amplifier 2, and a digital-to-analog converter (DA) 33 that converts a digital signal to an analog signal.

The constitution of the power amplification system of the present example is identical to that shown in FIG. 4 except a point that the digital-to-analog converter 33 is interposed between the adder 53 and error amplifier 21, and the operation thereof is identical to that of the power amplification system shown in FIG. 4 except that relating to the digital-to-analog converter 33. A description of the identical components will be omitted. For convenience' sake, in FIG. 9, the same reference numerals are assigned to the processing components identical to those shown in FIG. 4.

In the present example, the envelope detector 51, envelope delay circuit 52, low-pass filter 54, subtractor 55, peak hold circuit 56, and adder 53 are designed to perform digital processing. The digital-to-analog converter 53 inputs a signal outputted from the adder 53, converts it from a digital signal to an analog signal, and outputs the resultant signal to the error amplifier 21.

The principles of operation of the present example are identical to those of the power amplification system shown in FIG. 4. Since the foregoing circuits are designed to perform digital processing, the necessity of adjusting the circuits is obviated. This is advantageous in that the circuits can be readily realized.

Fifth Embodiment

A fifth embodiment of the present invention will be described below.

In the present embodiment, the power amplification system shown in FIG. 1 is taken for instance, and the advantage of the power amplification system will be described concretely. Incidentally, the constitution shown in FIG. 2 or FIG. 3 provides the same advantage.

In the present embodiment, by taking an actual orthogonal frequency division multiplexing (OFDM) signal for instance, pieces of processing to be performed by the low-pass filter 12, envelope delay circuit 14, subtractor 15, peak hold circuit 16, and adder 13 will be described below.

Figure 5:
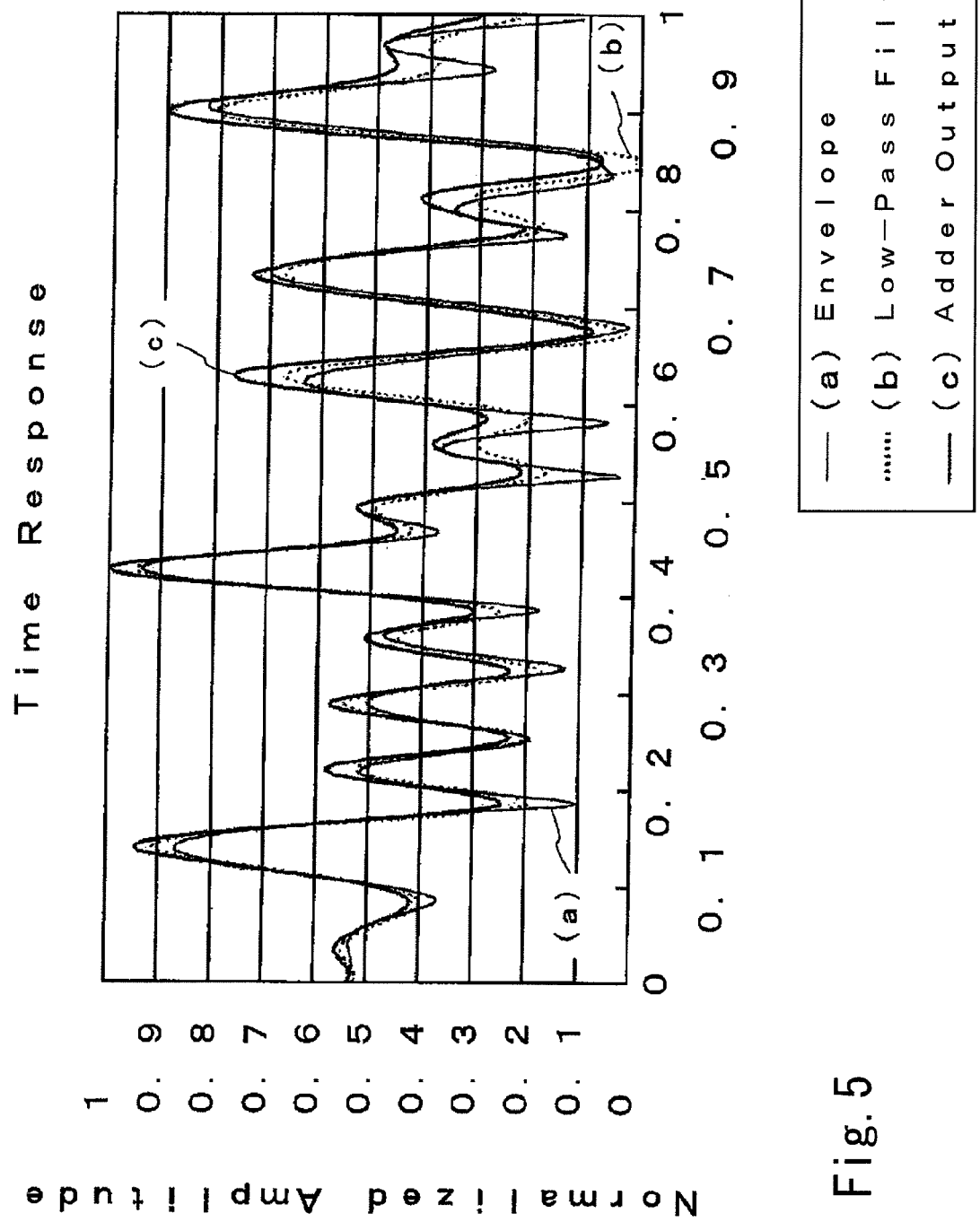
FIG. 5 is a diagram showing an example of waveforms representing an envelope, an output of a low-pass filter, and an output of an adder along with passage of time.
Figure 6:
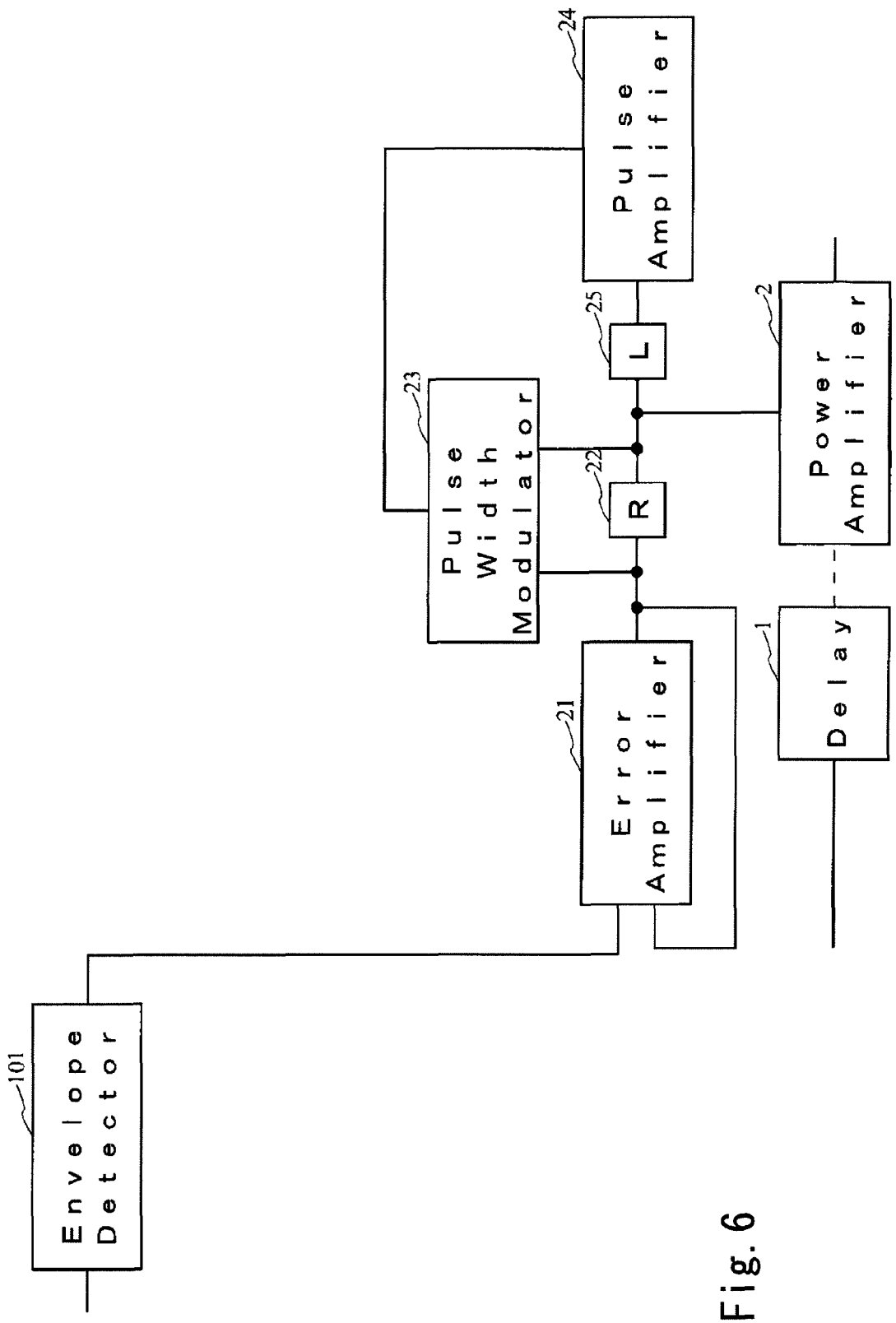
FIG. 6 is a diagram showing an example of the constitution of an envelope tracking type power amplification system in accordance with a related art.
Figure 7A:
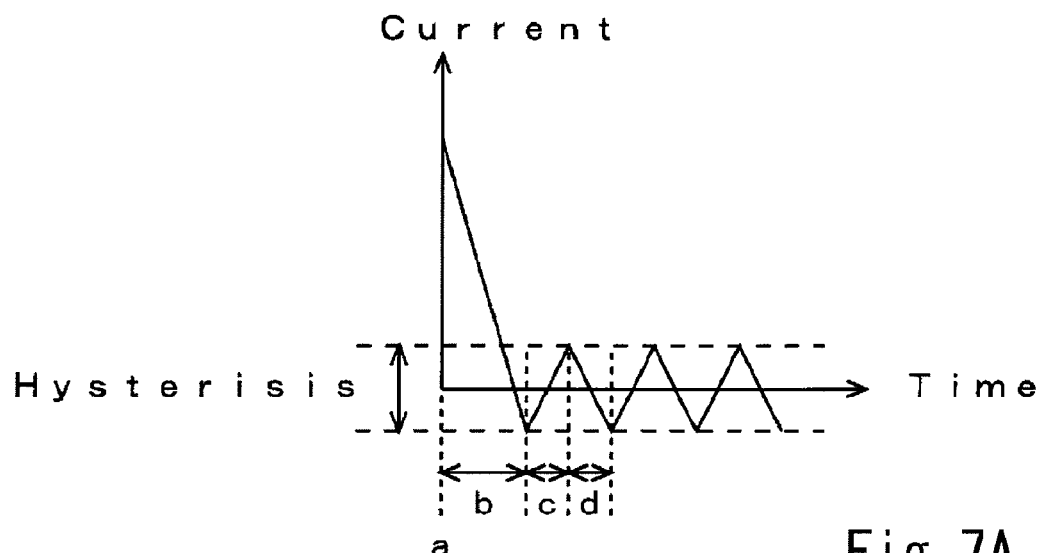
FIGS. 7A and 7B are diagrams for explaining the principles of operation of the envelope tracking type power amplification system in accordance with the related art.
Figure 7B:
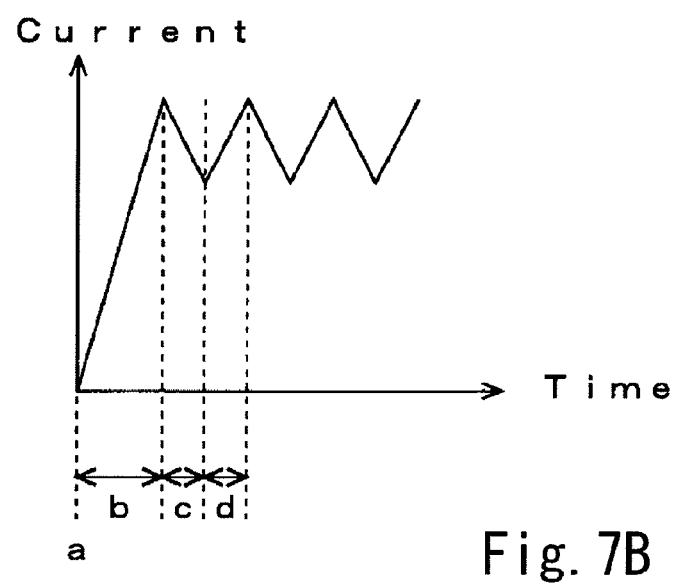

FIG. 5 shows an example of waveforms representing an envelope (a), an output (b) of the low-pass filter 12, and an output (c) of the adder 13 with the passage of time. The axis of abscissas indicates times normalized by numbers of samples, and the axis of ordinates indicates amplitudes normalized by maximum output voltages.

The waveforms shown in FIG. 5 are calculated basically on the assumption of the constitution shown in FIG. 3, and can be applied to the constitutions shown in FIG. 1 and FIG. 2.

The waveform of the envelope of an OFDM signal employed in the present embodiment is shown as the waveform (a) in FIG. 5.

The waveform of a low-frequency component extracted from the envelope by the low-pass filter 12 is shown as the waveform (b) in FIG. 5.

Further, a waveform having undergone the pieces of processing performed by the envelope delay circuit 14, subtractor 15, peak hold circuit 16, and adder 13 is shown as the waveform (c) in FIG. 5.

In the present embodiment, the low-pass filter 12 is characteristic of fully attenuating a normalized frequency of 0.03125 or higher.

In the present embodiment, the peak hold circuit 16 is designed to hold a peak during a normalized time of 0.0625. A transitional response made by elapse of the normalized time of 0.0625 is not shown in the drawing.

When the waveforms shown in FIG. 5 are taken into consideration, the low-pass filter output (b) which the low-pass filter 12 obtains by attenuating a high-frequency component takes on a voltage lower than an output voltage represented by the inputted envelope (a) at one timing. In other words, there is a timing when a supply voltage necessary to the power amplifier 2 is not outputted.

In contrast, the adder output (c) having undergone the pieces of processing performed by the envelope delay circuit 14, subtractor 15, peak hold circuit 16, and adder 13 takes on a voltage that is equal to or higher than that represented by the inputted envelope (a). In other words, a level (for example, a voltage) equal to or higher than a level represented by the envelope can be fed at any timing (for example, the timing of a high frequency).

Therefore, in the present embodiment, while high efficiency is sustained, a necessary supply voltage can be fed to the power amplifier 2. Eventually, the linearity of the power amplifier 2 can be ensured.

The constitutions of a system and device in accordance with the present invention are not necessarily limited to the aforesaid ones, but various constitutions may be adopted. In addition, the present invention may be provided as a method or scheme for executing pieces of processing in accordance with the present invention, a program for implementing the method or scheme, or a recording medium in which the program is recorded. The present invention may be provided as various systems or devices.

An application field of the present invention is not limited to the aforesaid one. The present invention can be applied to various fields.

Various pieces of processing to be performed by a system or device in accordance with the present invention may be configured to be controlled when a processor included in a hardware resource including the processor and a memory runs a control program stored in a read-only memory (ROM). Alternatively, various facilities or units for executing the pieces of processing may be independently formed as hardware circuits.

The present invention may be grasped as a recording medium readable by a computer, such as a floppy (registered trademark) disk or a CD (compact disc)-ROM, in which the above control program is stored, or as the control program (itself). The pieces of processing in accordance with the present invention may be performed by loading the control program from the recording medium to the computer and allowing a processor to run the control program.

What is claimed is:

1. A supply voltage control device for an amplifier that controls a supply voltage for the amplifier, comprising:
    a supply voltage control circuit including an error amplification circuit that feeds an error current so as to control the supply voltage for the amplifier, and a direct current feed circuit that feeds a direct current or the direct current and a current of a low-frequency component so as to control the supply voltage for the amplifier;
    a high-frequency component extraction unit that extracts a predetermined high-frequency component contained in a signal resulting from detection of an envelope relevant to a signal to be amplified by the amplifier;
    a peak hold unit that performs peak hold processing on a signal of the high-frequency component extracted by the high-frequency component extraction unit; and
    an addition unit that adds up a signal based on the result of the detection of the envelope relevant to the signal to be amplified by the amplifier, and a signal resulting from the peak hold processing performed by the peak hold unit, and inputs a signal resulting from the addition to the supply voltage control circuit.

2. The supply voltage control device for an amplifier according to claim 1, further comprising a low-pass filtration unit that passes a predetermined low-frequency component contained in the signal resulting from the detection of the envelope relevant to the signal to be amplified by the amplifier, wherein:
    the addition unit adds up a signal having passed through the low-pass filtration unit, and the signal resulting from the peak hold processing performed by the peak hold unit.

3. The supply voltage control device for an amplifier according to claim 2, wherein:
    the low-pass filtration unit is formed using a low-pass filter;
    the high-frequency component extraction unit is formed using the low-pass filter, an envelope delay circuit, and a subtractor;
    the peak hold unit is formed using a peak hold circuit;
    the addition unit is formed using an adder;
    in the high-frequency component extraction unit, the envelope delay circuit delays the signal resulting from the detection of the envelope relevant to the signal to be amplified by the amplifier and the subtractor subtracts the signal of the predetermined low-frequency component, which has passed through the low-pass filter, from the signal delayed by the envelope delay circuit so as to extract a high-frequency component.

4. The supply voltage control device for an amplifier according to claim 2, wherein:
    the low-pass filtration unit is formed using a low-pass filter;
    the high-frequency component extraction unit is formed using a high-pass filter,
    the peak hold unit is formed using a peak hold circuit; and
    the addition unit is formed using an adder.

5. The supply voltage control device for an amplifier according to claim 1, wherein:
    the high-frequency component extraction unit is formed using an envelope delay circuit, a low-pass filter, and a subtractor;
    the peak hold unit is formed using a peak hold circuit;
    the addition unit is formed using an adder;
    in the high-frequency component extraction unit,
    the envelope delay circuit delays the signal resulting from the detection of the envelope relevant to the signal to be amplified by the amplifier,
    the low-pass filter passes a predetermined low-frequency component contained in the signal resulting from the detection of the envelope relevant to the signal to be amplified by the amplifier, and
    the subtractor subtracts a signal of the predetermined low-frequency component, which has passed through the low-pass filter, from the signal delayed by the envelope delay circuit so as to extract a high-frequency component; and
    the addition unit adds up the signal delayed by the envelope delay circuit, and the signal resulting from the peak hold processing performed by the peak hold unit.

6. The supply voltage control device for an amplifier according to claim 3, further comprising a digital-to-analog converter that when the signal resulting from the addition performed by the adder, which forms the addition unit, is inputted to the supply voltage control circuit, converts the signal resulting from the addition from a digital signal to an analog signal, wherein:
    the low-pass filter, envelope delay circuit, subtractor, peak hold circuit, and adder perform digital processing.

7. The supply voltage control device for an amplifier according to claim 4, further comprising a digital-to-analog converter that when the signal resulting from the addition performed by the adder, which forms the addition unit, is inputted to the supply voltage control circuit, converts the signal resulting from the addition from a digital signal to an analog signal, wherein:
    the low-pass filter, high-pass filter, peak hold circuit, and adder perform digital processing.

8. The supply voltage control device for an amplifier according to claim 5, further comprising a digital-to-analog converter that when the signal resulting from the addition performed by the adder, which forms the addition unit, is inputted to the supply voltage control circuit, converts the signal resulting from the addition from a digital signal to an analog signal, wherein:
    the envelope delay circuit, low-pass filter, subtractor, peak hold circuit, and adder perform digital processing.

9. The supply voltage control device for an amplifier according to claim 1, wherein:
    the error amplification circuit is formed using an error amplifier and a resistor;
    the direct current feed circuit is formed using the resistor, a pulse width modulator, a pulse amplifier, and a coil;

in the error amplification circuit, the error amplifier amplifies by a predetermined gain an error between a voltage of a signal inputted from the addition unit and the supply voltage for the amplifier, and outputs the resultant signal to the resistor, and the resistor links an output terminal of the error amplifier and a supply voltage terminal of the amplifier so that the error current can be fed in order to control the supply voltage for the amplifier; and in the direct current feed circuit, the pulse width modulator generates a pulse width modulated signal according to a potential difference across the resistor, and outputs the signal to the pulse amplifier, the pulse amplifier amplifies the pulse width modulated signal inputted from the pulse width modulator, and outputs the resultant signal to the coil, and the coil links an output terminal of the pulse amplifier and the supply voltage terminal of the amplifier so that the direct current or the direct current and the current of the low-frequency component can be fed in order to control the supply voltage for the amplifier.

\* \* \* \* \*